United States Patent [19]

Yamashita

[11] 3,928,865

[45] Dec. 23, 1975

[54] PHOTO-ELECTRICAL TRANSDUCER

[75] Inventor: Akio Yamashita, Ikeda, Japan

[73] Assignee: Matsushita Electric Industrial Co., Ltd., Kadoma, Japan

[22] Filed: Apr. 21, 1971

[21] Appl. No.: 136,159

[30] Foreign Application Priority Data

Apr. 24, 1970 Japan ............................... 45-35757

[52] U.S. Cl. ........................ 357/30; 357/15; 357/64

[51] Int. Cl.$^2$ ................ H01L 29/48; H01L 29/56; H01L 29/167

[58] Field of Search ... 317/235 N, 235 UA, 235 AQ

[56] References Cited

UNITED STATES PATENTS

| | | | |
|---|---|---|---|
| 3,271,637 | 9/1966 | Webb | 317/234 |
| 3,390,311 | 6/1968 | Aven | 317/237 |
| 3,417,248 | 12/1968 | Hall | 250/211 |
| 3,424,910 | 1/1969 | Mayer | 250/211 |
| 3,436,613 | 4/1969 | Gerhard | 317/234 |
| 3,461,356 | 8/1969 | Yamashita | 317/234 |

*Primary Examiner*—Martin H. Edlow
*Attorney, Agent, or Firm*—Stevens, Davis, Miller & Mosher

[57] ABSTRACT

A photo-electrical transducer element comprising a semiconductor body, a rectifying barrier formed in the semiconductor body, and electrodes formed on said semiconductor body on both sides of said barrier. A deep-level-forming impurity is heavily doped in the neighborhood of the rectifying barrier.

1 Claim, 3 Drawing Figures

INVENTOR

BY

ATTORNEY

PHOTO-ELECTRICAL TRANSDUCER

This invention relates to a photo-electrical transducer.

Conventionally, as photo-electrical transducers, there have been developed photoconductive cells and solar (photovoltaic) cells using semiconductors.

However, they have a disadvantage in that their efficiency cannot be made very high. For example, a solar cell using silicon has an efficiency of about 24% and one using gallium arsenide has an efficiency of about 28%. Thus for utilizing conventional elements as a power source, a considerable number of solar cells must be used.

An object of this invention is to provide a photo-electrical transducer having a high efficiency.

According to this invention, there is provided a photoelectrical transducer comprising a semiconductor body including a rectifying barrier and doped with a deep-level-forming impurity in the neighborhood of said rectifying barrier, and electrodes provided on said semiconductor body on both sides of said rectifying barrier, said transducer having an efficiency much better than the conventional one.

Now, description will be made with reference to the accompanying drawing, in which.

Figure 1:
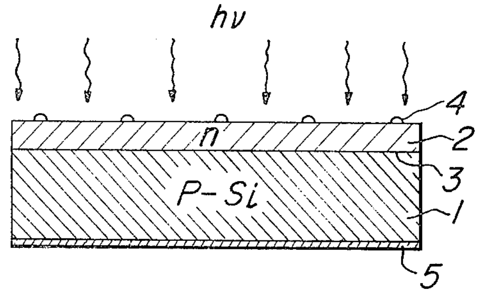
FIG. 1 PRIOR ART
FIG. 1 is a cross-section of a conventional solar cell.

First, as an example of photo-electrical transducers, a conventional solar cell will be described. Referring to FIG. 1, in which silicon is used as the matrix semiconductor, reference numerals 1 and 2 indicate p and n type silicon, 3 a pn junction, 4 and 5 upper and lower electrodes, respectively. A light beam is arranged to radiate from the upper side. When photons having energies of not less than the forbidden band width of the semiconductor impinge thereon, electrons in the valence band may be excited to the conduction band and an electromotive force is generated.

The efficiency is defined by the ratio of output to input energy and usually is 20 to 30%.

In this specification, a rectifying barrier means a pn junction, metalsemiconductor junction, etc. Further, a deep-level-forming impurity means an impurity which forms a deep energy level or levels in the forbidden band and has a greater probability for recombination than that for trapping free carriers, such as iron, copper, gold, manganese and nickel.

Figure 2:
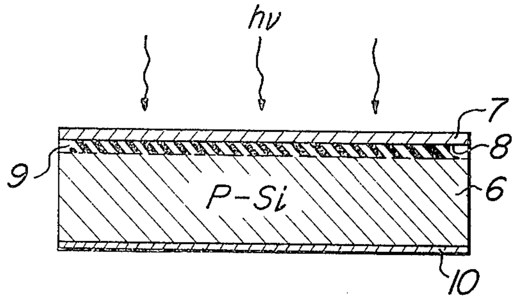
FIG. 2 is a cross-section of an embodiment of a photoelectrical transducer according to this invention.

An embodiment of this invention will now be described. FIG. 2 shows a metal-semiconductor junction using p type silicon. Reference numeral 6 indicates a p type silicon, 7 a metal electrode using niobium, 8 a metal-semiconductor junction, 9 a region heavily doped with a deep-level-forming impurity, 10 a metal electrode. The element shown in FIG. 2 may be made as follows. First a pellet of p type silicon single crystal is oxidized in an oxidizing atmosphere to form a silicon oxide film on the surface. Then, the silicon oxide film on one side is removed by an etching technique and a deep-level-forming impurity, in this case copper, is vapor deposited on the exposed surface. Then, the pellet is heated in an inert atmosphere to diffuse the impurity. Copper impurities diffuse through the silicon body and these are mostly trapped in the neighborhood of the opposite silicon oxide-silicon interface to form the region 9 of FIG. 2. Then, the silicon oxide film is removed, and as the electrode on the light receiving side niobium is thinly sputtered and as the electrode on the other side gold or gallium is alloyed. The samples thus made but with varying diffusion conditions developed the following open circuit voltages under constant illumination, at a wavelength of 1000 m$\mu$:

Table 1

| Sample number | Copper diffusion | Open circuit voltage |
|---|---|---|
| 1 | no diffusion | 0.30 mV |
| 2 | 800°C 60 min. | 0.95 mV |
| 3 | 1000°C 10 min. | 2.6 mV |
| 4 | 1000°C 30 min. | 2.6 mV |
| 5 | 1000°C 180 min. | 6.5 mV |

As is evident from the table, copper diffusion increases the efficiency of photo-electric transformation.

Figure 3:
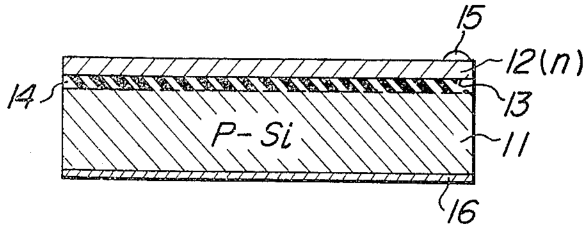
FIG. 3 is a cross-section of another embodiment of a photo-electrical transducer.

Another embodiment employing a pn junction will now be described. FIG. 3 shows an element having a pn junction comprising a p type silicon 11, an n type silicon 12, a pn junction 13 formed therebetween, a region 14 heavily doped with a deep-level-forming impurity, and an upper electrode and a lower electrode 15 and 16, respectively. Elements of such a structure can be made by conventional diffusion technique. The photovoltaic characteristics under a constant intensity illumination at a wavelength of 1000 m$\mu$ are as shown in Table 2:

Table 2

| Sample number | Copper diffusion | Open circuit voltage |
|---|---|---|
| 1 | no diffusion | 4.0 mV |
| 2 | 800°C 60 min. | 11 mV |
| 3 | 1000°C 10 min. | 35 mV |
| 4 | 1000°C 30 min. | 34 mV |
| 5 | 1000°C 180 min. | 120 mV |

In this case also, copper diffusion increases the photoelectrical transducing efficiency.

In the foregoing, silicon is employed as the semiconductor, but it may be substituted by any one of GaAs, CdTe, Ge, InP, AlSb, GaP, CdS, etc.

As is apparent from the foregoing description, a photoelectrical transducer according to this invention has a higher efficiency than a conventional one and hence provides a larger current with a smaller area. Thus, smaller and lighter elements can be provided.

What is claimed is:

1. A photoelectric transducer comprising a semiconductor wafer, a metal layer on the semiconductor wafer, the semiconductor wafer and the metal layer forming a Schottky barrier therebetween, and a region in the neighborhood of the Schottky barrier heavily doped with a deep-level impurity selected from the group consisting of copper, gold, iron, nickel and manganese.

* * * * *